US007651938B2

(12) United States Patent
Too et al.

(10) Patent No.: US 7,651,938 B2
(45) Date of Patent: Jan. 26, 2010

(54) VOID REDUCTION IN INDIUM THERMAL INTERFACE MATERIAL (75) Inventors: Seah Sun Too, San Jose, CA (US); Hsiang Wan Liau, Penang (MY); Janet Kirkland, Fremont, CA (US); Tek Seng Tan, Penang (MY); Maxat Touzelbaev, San Jose, CA (US); Raj N. Master, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 567 days.

(21) Appl. No.: 11/422,795

(22) Filed: Jun. 7, 2006

(65) Prior Publication Data

US 2007/0284737 A1 Dec. 13, 2007

(51) Int. Cl.
*H01L 21/44* (2006.01)
*H01L 23/12* (2006.01)

(52) U.S. Cl. ............... 438/615; 438/612; 438/108; 257/704; 257/779; 257/778; 257/E23.109

(58) Field of Classification Search ............... 438/612, 438/615, 108, 118, 122, 613; 257/704, 772, 257/778, E23.109
See application file for complete search history.

(56) References Cited

U.S. PATENT DOCUMENTS 5,455,457 A * 10/1995 Kurokawa ............... 257/712

| 6,748,350 | B2 | 6/2004 | Rumer et al. |
| 6,848,172 | B2 | 2/2005 | Fitzgerald et al. |
| 6,848,610 | B2 | 2/2005 | Liu |
| 6,867,978 | B2 | 3/2005 | Whittenburg et al. |
| 6,870,258 | B1 | 3/2005 | Too |
| 6,882,535 | B2 | 4/2005 | Labanok et al. |
| 6,924,170 | B2 | 8/2005 | Ravi et al. |
| 6,934,154 | B2 | 8/2005 | Prasher et al. |
| 6,936,501 | B1 | 8/2005 | Too et al. |
| 6,987,317 | B2 | 1/2006 | Pike |
| 6,989,586 | B2 | 1/2006 | Agraharam et al. |
| 7,009,289 | B2 | 3/2006 | Hu et al. |
| 7,012,011 | B2 | 3/2006 | Chrysler et al. |
| 7,014,093 | B2 | 3/2006 | Houle et al. |
| 7,015,073 | B2 | 3/2006 | Houle et al. |
| 7,218,000 | B2 * | 5/2007 | Houle ............... 257/714 |
| 7,492,039 | B2 * | 2/2009 | Seng ............... 257/686 |
| 2003/0096453 | A1 * | 5/2003 | Wang et al. ........ 438/108 |
| 2004/0262766 | A1 * | 12/2004 | Houle ............... 257/758 |
| 2005/0253258 | A1 * | 11/2005 | Steers et al. ......... 257/734 |
| 2006/0060988 | A1 * | 3/2006 | Edwards ............ 257/794 |
| 2007/0051774 | A1 * | 3/2007 | Stipp et al. ......... 228/101 |
| 2007/0152321 | A1 * | 7/2007 | Shi et al. ........... 257/704 |

* cited by examiner

*Primary Examiner*—Nitin Parekh
(74) *Attorney, Agent, or Firm*—Timothy M. Honeycutt (57) ABSTRACT Thermal interface materials and method of using the same in packaging are provided. In one aspect, a thermal interface material is provided that includes an indium preform that has a first surface and a second surface opposite to the first surface, an interior portion and a peripheral boundary. The indium preform has a channel extending from the peripheral boundary towards the interior portion. The channel enables flux to liberate during thermal cycling.

18 Claims, 7 Drawing Sheets

VOID REDUCTION IN INDIUM THERMAL INTERFACE MATERIAL

BACKGROUND OF THE INVENTION

1. Field of the Invention

This invention relates generally to semiconductor processing, and more particularly to methods of attaching a lid to an integrated circuit package and to providing a thermal interface material therefor.

2. Description of the Related Art

Many current integrated circuits are formed as multiple die on a common wafer. After the basic process steps to form the circuits on the die are complete, the individual die are cut from the wafer. The cut die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and substrate interconnects to establish ohmic contact. After the die is mounted to the substrate, a lid is attached to the substrate to cover the die. Some conventional integrated circuits, such as microprocessors, generate sizeable quantities of heat that must be ferried away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material ideally fully contacts both the upper surface of the integrated circuit and the portion of the lower surface of the lid that overlies the integrated circuit. Conventional thermal interface materials include various types of pastes, and in some cases, a metal. More recently, designers have begun to turn to indium as a thermal interface material.

The attachment of a lid to a die substrate involves a complex choreography of steps. The thermal interface material must be applied to the die. An adhesive must be applied to the substrate and cured in such a way that does not produce unwanted irregularities in the thickness or wetting of the thermal interface material. The lid must be attached to the substrate so that the tilt of the lid relative to the die is within acceptable tolerances. High tilt can lead to nonuniformities in thermal interface material thickness, which can produce poor heat transfer characteristics.

Indium as a thermal interface material presents certain challenges. A consistent metallurgical bond between the integrated circuit and the indium, and in turn, between the indium and the package lid is desirable in order to provide a uniform thermal resistance of heat transfer pathway away from the integrated circuit and into the lid. Achieving the necessary wetting of indium is not a trivial matter. Furthermore, the aforementioned tilt of the lid may be impacted by thermally-induced movement of the lid adhesive during steps to bond the indium.

Current techniques for establishing metallurgical bonding between a lid, an integrated circuit and the indium thermal interface material sandwiched therebetween involves the use of a flux film applied to both the upper surface of the integrated circuit and the upper surface of the indium thermal interface material. A subsequent reflow process produces a melting followed by a solidification of the indium material which produces the metallurgical bonding. In an ideal process, the flux would be completely displaced during the reflow such that a relatively homogeneous layer of indium remains after reflow. However, conventional indium thermal interface material is applied as a solid sheet or preform. During reflow, the edges of the indium preform can solidify and create a physical barrier that blocks the escape routes for flux remnants. Trapped flux remnants can result in the formation of voids in the indium. Voids in the indium represent areas of higher thermal resistance. Depending on the location of these "hot spots," device performance can be adversely impacted.

The conventional continuous-sheet indium preform presents a further technical challenge for packages of really large die, such as those associated with multiple logic cores. There is typically a disparity between the coefficients of thermal expansion of the lid, the integrated circuit die and the thermal interface material. These mismatches produce a warping or cambering of the integrated circuit die that can induce significant stresses in the die. It turns out that die warpage tends to increase with die size. The stresses imposed on the die are a function of not only die size, but also the compliance of the thermal interface material. A continuous-sheet indium preform may not exhibit sufficient compliance to keep die stresses below acceptable levels for very large die.

The present invention is directed to overcoming or reducing the effects of one or more of the foregoing disadvantages.

SUMMARY OF THE INVENTION

In accordance with one aspect of the present invention, a thermal interface material is provided that includes an indium preform that has a first surface and a second surface opposite to the first surface, an interior portion and a peripheral boundary. The indium preform has a channel extending from the peripheral boundary towards the interior portion.

In accordance with another aspect of the present invention, an integrated circuit is provided that includes a die that has a surface. An indium preform is positioned on the surface of the die. The indium preform has a first surface and a second surface opposite to the first surface, an interior portion and a peripheral boundary. The indium preform has a channel extending from the peripheral boundary towards the interior portion.

In accordance with another aspect of the present invention, an integrated circuit is provided that includes a die that has a first surface and a second surface and a plurality of logic cores. A plurality of indium preforms is positioned on the first surface of the die. The preforms are positioned in spaced apart relation to one another prior to melting such that each of the plurality of indium preforms is positioned over and corresponds to one of the plurality of logic cores.

In accordance with another aspect of the present invention, an integrated circuit is provided that includes a die that has a first surface and a second surface and a plurality of logic cores. A plurality of indium preforms is positioned on the first surface of the die. The preforms are positioned in spaced apart relation to one another prior to melting such that each of the plurality of indium preforms is positioned over and corresponds to one of the plurality of logic cores. A substrate is coupled to the second surface of the die and a lid is coupled to the substrate.

In accordance with another aspect of the present invention, a method of packaging an integrated circuit is provided. An integrated circuit is mounted on a substrate. An indium preform is coupled to the integrated circuit. The indium preform has a first surface and a second surface opposite to the first surface, an interior portion and a peripheral boundary. The indium preform has a channel extending from the peripheral boundary towards the interior portion.

In accordance with another aspect of the present invention, a method of packaging an integrated circuit that has a plurality of logic cores is provided. An integrated circuit that has a plurality of logic cores is mounted on a substrate. An indium preform is provided for each of the logic cores. The indium preforms are positioned on the integrated circuit in spaced apart relation to one another prior to melting such that each of the plurality of indium preforms is positioned over and corresponds to one of the plurality of logic cores.

In accordance with another aspect of the present invention, an integrated circuit package lid is provided that includes a lid and an indium preform coupled to the lid. The indium preform has a first surface and a second surface opposite to the first surface, an interior portion and a peripheral boundary. The indium preform also has a channel extending from the peripheral boundary towards the interior portion.

In accordance with another aspect of the present invention, a method of packaging an integrated circuit is provided that includes mounting an integrated circuit on a substrate, providing a lid, and coupling an indium preform to the lid. The indium preform has a first surface and a second surface opposite to the first surface, an interior portion and a peripheral boundary. The indium preform also has a channel extending from the peripheral boundary towards the interior portion. The lid is coupled to the substrate.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
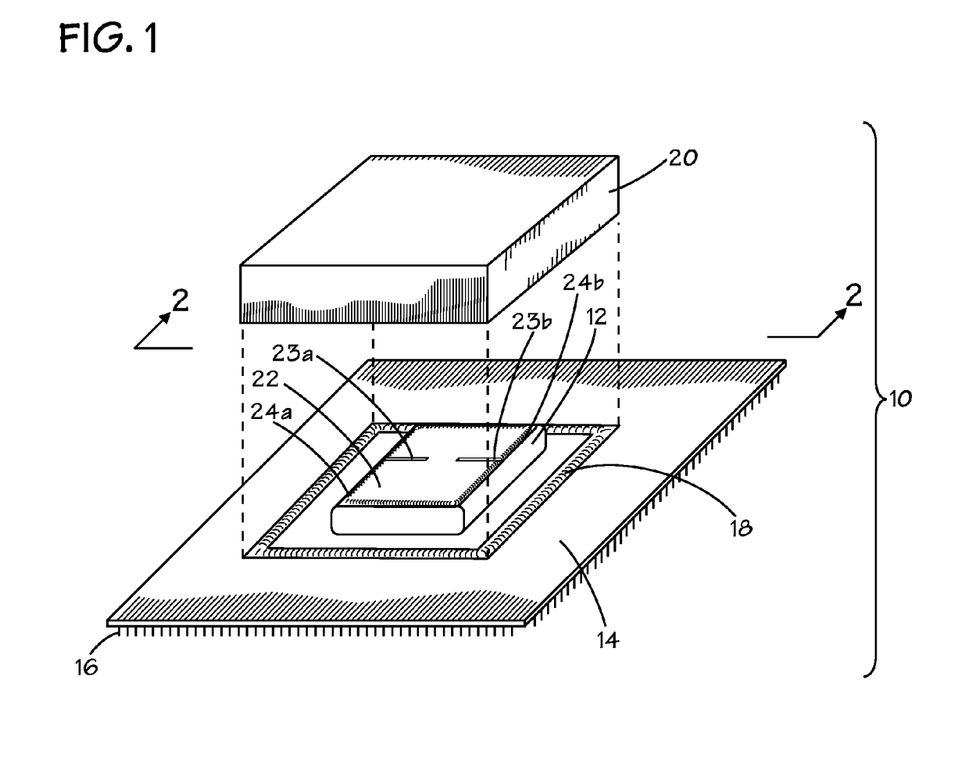
FIG. 1 is an exploded pictorial view of an exemplary embodiment of an integrated circuit package in accordance with the present invention.
Figure 2:
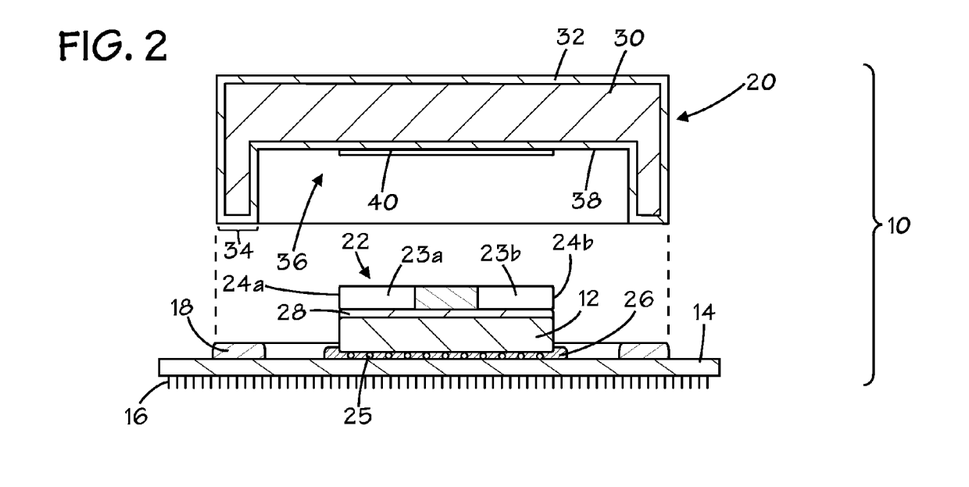
FIG. 2 is a sectional view of FIG. 1 taken at section 2-2 in accordance with the present invention.

In the drawings described below, reference numerals are generally repeated where identical elements appear in more than one figure. Attention is now turned to FIGS. 1 and 2. FIG. 1 is an exploded pictorial view and FIG. 2 is a sectional view of an exemplary embodiment of an integrated circuit package 10 that includes an integrated circuit 12 mounted on a substrate 14. The substrate 14 may be provided with a plurality of conductor pins 16 that form a pin grid array or other pin-type arrangement for providing electrical connection to a socket or other type of electrical connection. Optionally, the substrate 14 may utilize some other form of interconnect, such as, for example, a land grid array or other types of interconnect structures. An adhesive film 18 is provided on the upper surface of the substrate 14 to secure a lid 20 to the substrate 14. The lid 20 is shown exploded from the substrate 14. To facilitate heat transfer from the integrated circuit 12 to the lid 20, a thermal interface material 22, preferably composed of indium, is disposed on the integrated circuit 12. When the lid 20 is positioned on the substrate 14 and the adhesive film 18 is fully cured as described more fully below, the indium thermal interface material 22 will establish a metallurgical bond with both the integrated circuit 12 and the overlying lid 20. For reasons to be explained later, two channels 23a and 23b, are initially provided in the thermal interface material 22. The channels 23a and 23b, extend from a peripheral boundary, in this case the edges 23a and 23b, towards the interior of the thermal interface material 22.

Referring now primarily to FIG. 2, the integrated circuit 12 may be secured to the substrate 14 in a great variety of ways. In the embodiment illustrated, the integrated circuit 12 is flip-chip mounted to the substrate 14. A plurality of solder bumps 25 are positioned between the lower surface of the integrated circuit 12 and the upper surface of the substrate 14. The bumps 25 provide electrical interconnects between the integrated circuit 12 and a plurality of electrical conductors (not shown) positioned on the substrate 14 that are interconnected to the conductor pins 16. An underfill layer 26 is provided beneath the integrated circuit 12 to serve principally as a cushion against both physical and thermal expansion loads subjected to the integrated circuit 12.

To facilitate the wetting of the indium thermal interface material 22 to the integrated circuit 12, the upper surface, i.e., the backside, of the integrated circuit 12 is provided with a metallization stack 28 that consists of an aluminum film formed on the integrated circuit 12, a titanium film formed on the aluminum film, a nickel-vanadium film formed on the titanium film and a gold film formed on the nickel-vanadium film. The aluminum film provides advantageous adhesion with silicon. The titanium film provides a barrier layer to prevent gold from migrating into the integrated circuit 12, the nickel-vanadium film provides desirable adhesion between with gold and the gold film provides a desirable wetting surface for indium. The selection appropriate materials for the backside metallization will depend on the composition of the integrated circuit 12 and the thermal interface material 22. The stack 28 is formed on the integrated circuit 12 prior to application of the thermal interface material 22.

The lid 20 is advantageously composed of a material or materials with a relatively favorable conductive heat transfer coefficient. In an exemplary embodiment, the lid 20 consists of a copper core 30 surrounded by a nickel jacket 32. The lid 20 is generally rectangular and may be substantially square if desired. The lid 20 includes a downwardly projecting perimeter wall 34 that defines an interior space 36. The interior space 36 is sized to more than accommodate the footprint of the integrated circuit 12 and the overlying thermal interface material 22. Note that the adhesive film 18 is applied to the upper surface of the substrate 14 with a footprint that generally tracks the footprint of the perimeter wall 34 of the lid 20. To facilitate metallurgical bonding between the thermal interface material 22 composed of indium and the lower surface 38 of the lid 20, a thin film of gold 40 is positioned on the lower surface 38 of the lid 20. The various thicknesses of the thermal interface material 22, the gold film 40 as well as the vertical dimension of the interior space 36 are selected so that when the lid 20 is seated on the adhesive film 18, the thermal interface material 22 and the overlying gold film 40 will be in physical contact.

Figure 3:
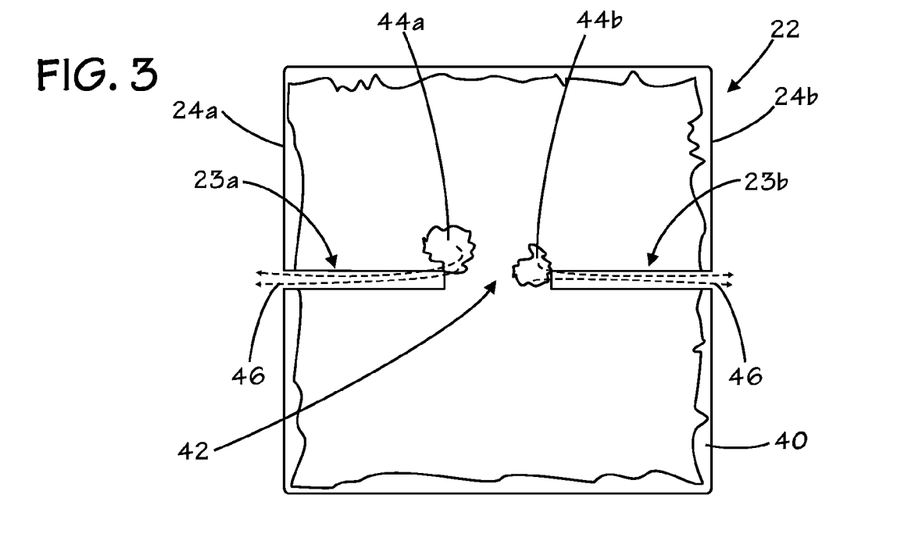
FIG. 3 is a plan view of an exemplary thermal interface material depicted in FIGS. 1 and 2 in accordance with the present invention.

The structure and function of the channels 23a and 23b, in the thermal interface material 22 will now be described. Attention is turned to FIG. 3, which is a plan view of the thermal interface material 22. The underlying integrated circuit 12 is not depicted for simplicity of illustration. It should be understood that FIG. 3 depicts the thermal interface material 22 shortly after commencement, but before completion, of a reflow process. At this stage a portion of the thermal interface material 22 has undergone solidification to produce a solid barrier 40 that extends around the perimeter of the thermal interface material 22. Prior to reflow, a preform of the thermal interface material 22 is positioned on the integrated circuit (12 in FIGS. 1 and 2). The preform of the thermal interface material 22 includes the channels 23a and 23b. As noted elsewhere herein, a flux is applied to the interface between the thermal interface material 22 and the underlying integrated circuit 12 as well as on top of the thermal interface material 22 at the interface between the thermal interface material 22 and the overlying lid 20 or the gold film 40 as the case may be depicted in FIG. 2. The purpose of the flux is to facilitate an ultimate metallurgical bonding between the thermal interface material 22 and the overlying metal and the underlying metal stack 28 of the integrated circuit 12. As noted in the Background section hereof, pockets of the flux may be trapped in the interior 42 of the thermal interface material during the reflow process. Two such exemplary flux remnants 44a and 44b are depicted in FIG. 3. It is desirable for the flux remnants 44a and 44b to volatilize and liberate as completely as possible from the thermal interface material 22. Otherwise, and as noted in the Background section hereof, the unliberated remnants of flux 44a and 44b can lead to an incomplete reflow of the thermal interface material 22 and the formation of voids in the vicinity of the flux remnants 44a and 44b. Such voids can present regions of extremely poor thermal conductivity between the underlying integrated circuit 12 depicted in FIG. 2 and the overlying lid 20.

The channels 23a and 23b, provide an outlet for liquid and gaseous remnants 46 of the flux remnants 44a and 44b to escape from the interior 42 of the thermal interface material 22 to the edges 24a and 24b thereof. In this way, any flux remnants 44a and 44b proximate the channels 23a and 23b, can more completely volatilize and be liberated from the thermal interface material and thus avoid the formation of voids. Accordingly, it is desirable for the channels 23a and 23b, to extend from the peripheral boundary of the thermal interface material 22 toward the interior portion 42 thereof. In this illustrative embodiment, the peripheral boundary is rectangular and includes the edges 24a and 24b, and the channels 23a and 23b, extend inwardly towards the interior, respectively, from the edges 23a and 23b. Of course, the peripheral boundary may be almost any shape. The size and shape of the channels 23a and 23b, may be subject to great variety. In the embodiment illustrated in FIG. 3, the channel 23a and 23b, are relatively rectangular. However, since the channels 23a and 23b, can be formed by a variety of processes, such as cutting, punching, ablative techniques or other material shaping techniques, the exact geometry of the channels 23a and 23b, is again subject to great variety. It should also be understood that the channels 23a and 23b, need not extend completely through the depth of the integrated circuit 12, that is, from the top surface to the lower surface of the integrated circuit 12. Furthermore, a single channel, either 23a or 23b could be used to provide an escape path for trapped flux.

Figure 4:
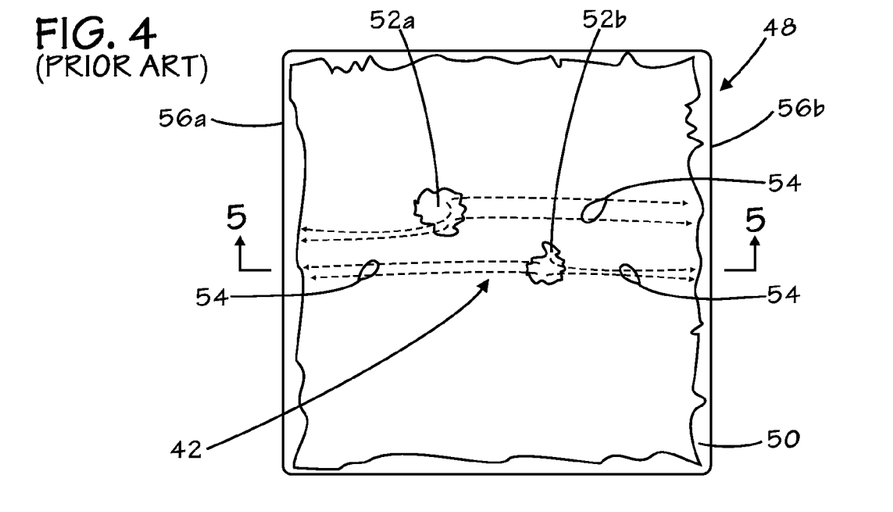
FIG. 4 is a plan view of a conventional thermal interface material.
Figure 5:
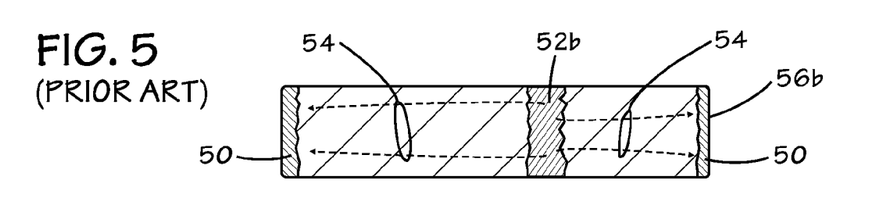
FIG. 5 is a sectional view of FIG. 4 taken at section 4-4.

The benefit of the channels 23a and 23b, maybe understood in more detail by considering the workings of a conventional thermal interface material, which is depicted in FIGS. 4 and 5. FIG. 4 is a plan view of a conventional thermal interface material 48 that is a continuous layer, that is, without one or more channels. Like the embodiment depicted in FIG. 3, the conventional interface material 48 is depicted in a state just after the beginning of a reflow process in which the outer edge portion 50 of the thermal interface material 48 has begun to solidify. Two exemplary flux remnants 52a and 52b are depicted as shown in FIG. 4 and also FIG. 5, which is a sectional view taken at section 4-4. During the reflow process, the constituents 54 from the flux remnants 52a and 52b are blocked from leaving the thermal interface material 48 by the solidified crust 50 forming at the edges 56a and 56b of the thermal interface material 48. Without an outlet, the flux remnants 52a and 52b will possibly lead to the formation of voids in the thermal interface material 48 and attendant hot spots.

An exemplary process flow in accordance with the present invention for attaching the lid 20 to the substrate 14 will now be described in conjunction with FIGS. 1, 2 and 3. Following the mounting of the integrated circuit 12 and the fabrication of the backside metal stack 28, the adhesive film 18 is applied to the substrate 14 in step 60. One example of a suitable adhesive 18 is silicone-based thixotropic adhesive, which provides a compliant bond.

Figure 6:
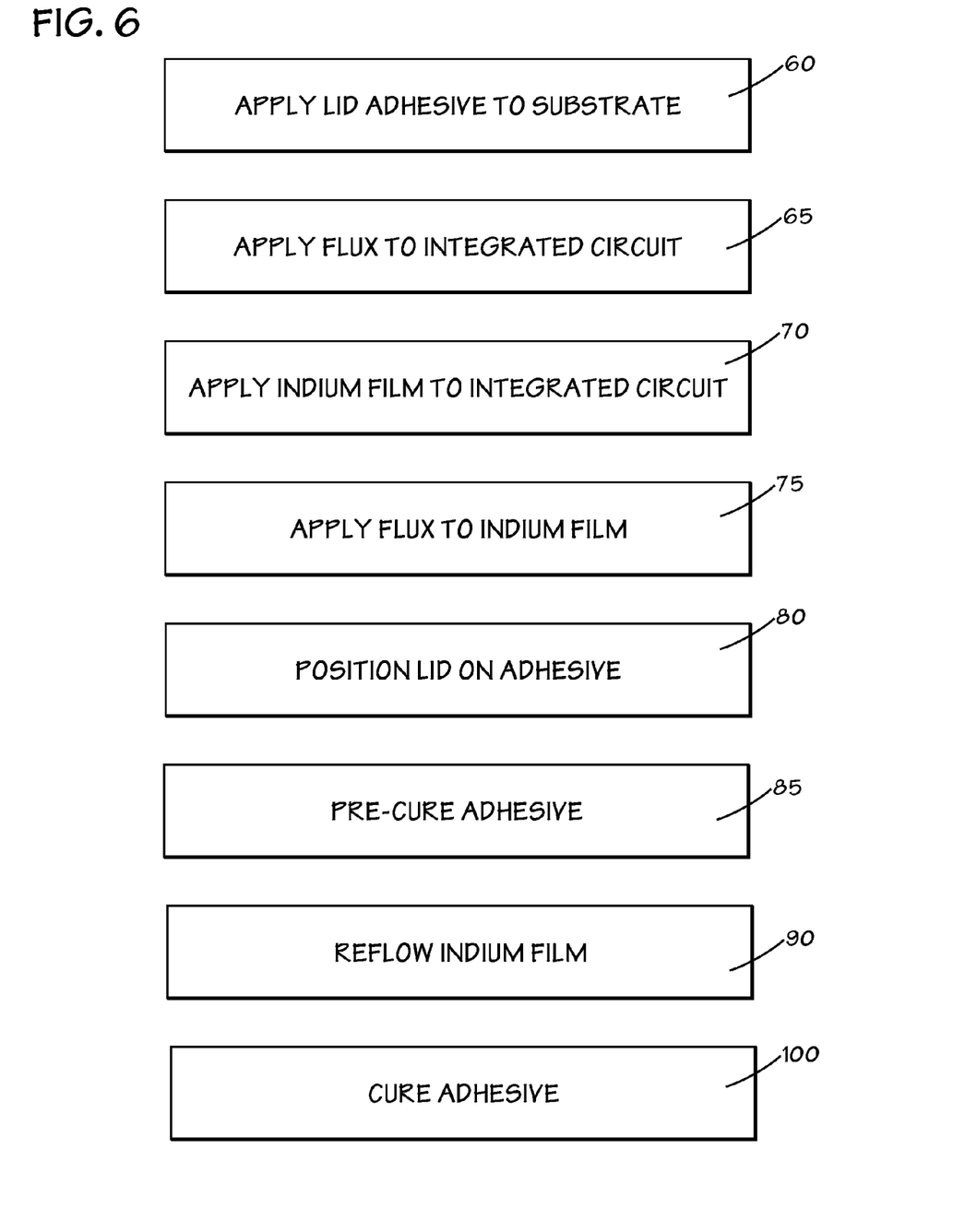
FIG. 6 is a flow chart of exemplary process steps to assemble the integrated circuit package depicted in FIGS. 1 and 2 in accordance with the present invention.

At step 65, a film of flux is applied to the integrated circuit 12. The purpose of the flux is to facilitate an ultimate metallurgical bonding between the later-applied indium thermal interface material and the backside metallization stack 28. A rosin-based flux is advantageously used as the flux material. In an exemplary embodiment, the flux may consist of about 20 to 50% by weight rosin mixed with isopropyl alcohol. A jet spray or other suitable application technique may be used to apply the flux.

At step 70, the indium thermal interface material 22 is applied to the integrated circuit 12. This may be done in at least two ways. In this illustrative embodiment, a preformed film of indium with roughly the same footprint as the integrated circuit is applied to the backside metallization 28. An alternative to be discussed below, involves securing the thermal interface material to the lid and then bringing the lid into contact with the integrated circuit 12. The preformed indium thermal interface material 22 may be supplied in a variety of forms. In an exemplary embodiment, preformed pieces of indium may be supplied on a tape that is positioned on a reel. The tape is advanced and individual preformed pieces or sheets of indium are removed from the tape and placed on the integrated circuit 12. The movement of the indium preforms may be by hand, an automated pick and place mechanism or other type of mechanism. The ultimate uniformity in terms of thickness and material distribution of the indium thermal interface material 22 is a function of the degree of tilt of the lid 20 with respect to the substrate 14. It is desirable for the degree of tilt to be as small as possible. The indium thermal interface material 22 will require a reflow process to establish the desired metallurgical bonding with the lid 20 and the integrated circuit 12. It is desired that the reflow process not adversely impact the tilt characteristics of the lid 20. Accordingly, it is preferable to perform a precure process on the adhesive 18. The goal of the precure process is to partially harden the adhesive 18 before the indium thermal interface material 22 undergoes a reflow. In this way, the reflow process will not cause substantial movement either laterally or vertically of the adhesive film and thus the overlying lid 20 during the indium reflow process.

Prior to precure, flux is applied to the indium film 22 at step 75 and the lid 20 is seated on the adhesive film 18 at step 80. A rosin-based flux of the type described elsewhere herein may be used. The seating process may be accomplished by hand with the aid of a guide rack to be described in more detail below or by way of an automated machine. The lid 20 may be preheated prior to seating on the adhesive 18. For example, the lid 20 may be heated to about 100 to 135° C. for 5.0 to 10.0 minutes. The preheated lid 20 is next seated on the adhesive 18. It is anticipated that the temperature of the lid 20 will drop by perhaps 10.0 to 15.0° C. before being seated on the adhesive 18. At the time when the lid 20 is seated on the adhesive 18, the substrate 14 may be positioned in a fixture also to be described in more detail below and a compressive force applied to the lid 20 by way of the fixture. It should be noted that the adhesive 18 may be applied at any point prior to the seating of the lid 20.

With compressive force applied, the substrate 14 and lid combination 20 are subjected to a precure heating at step 85. Suitable temperatures and times for the precure will depend on the adhesive and the thermal interface material. Fast curing adhesives may require as little as about 2.0 minutes at 100° C., however, a precure time of up to an hour will be more typical. The precure process will fix the indium bond line thickness, that is, the thickness of the thermal interface material 22.

Following the precure at step 85, an indium reflow step is performed at step 90. In an exemplary process for indium, the package 10 may be placed in a belt furnace with a nitrogen purge, and heated to about 170 to 190 ° C. for about 3.0 to 10.0 minutes. The reflow is advantageously performed without compressive force applied to the lid 20. Again, the goal of the indium reflow is to establish metallurgical bonding between the indium thermal interface material 22 and the overlying gold film 40 and the underlying backside metallization stack 28.

Following the indium reflow step 90, the adhesive film 18 undergoes a final curing process at step 100. The curing process is performed without compressive force applied to the lid 20. The final cure may be performed at about 125° C. for about 1.5 hours. Again the temperature and time will depend on the adhesive used.

Figure 7:
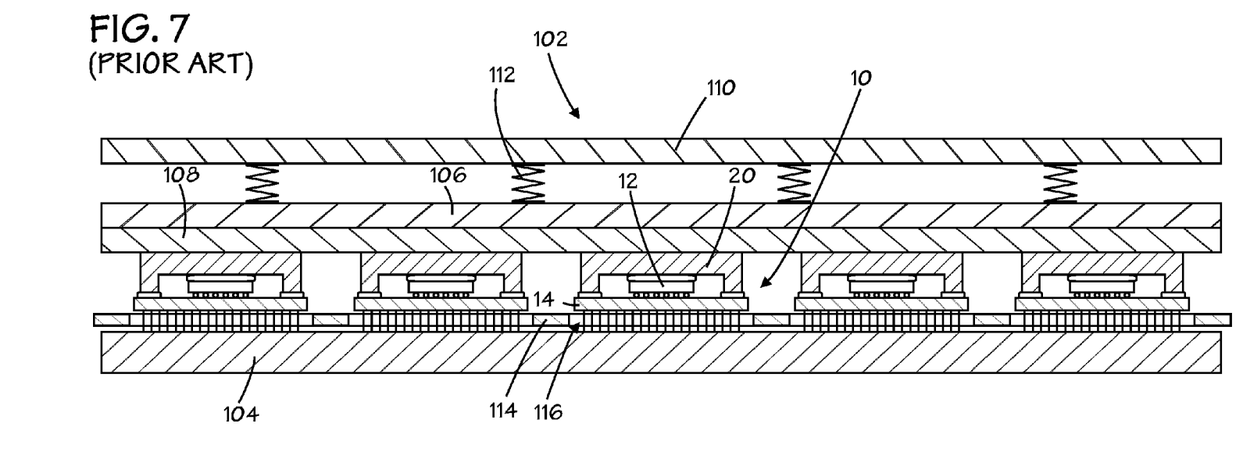
FIG. 7 is a sectional view of an exemplary package fixture to hold the exemplary integrated circuit package of FIG. 1 in accordance with the present invention.

In the process flow described elsewhere herein in conjunction with FIG. 6, it was noted that a fixture may be used to hold an integrated circuit package, such as the package 10 during various process steps. An exemplary embodiment of such a fixture 102 is depicted in FIG. 7, which is a cross-sectional view. A number of integrated circuit packages are depicted, however only one of the packages 10 is provided with element numbering. The description that follows focuses on the package 10, but is illustrative of any packages held by the fixture 102. The fixture 102 includes a base plate 104 upon which the circuit package 10 is seated. A middle plate 106 is designed to seat on top of the circuit package 10. The middle plate 106 is provided with a compliant sheet 108 composed of rubber or other compliant material. The middle plate 106 is brought into secure engagement with the upper surfaces of the circuit package 10 by way of a top plate 110 that includes a plurality of springs 112. Pressure is applied downward on the top plate 110 by an automated machine or manual clamps and results in a downward force transmitted through the middle plate 106 to the circuit package 10.

Figure 8:
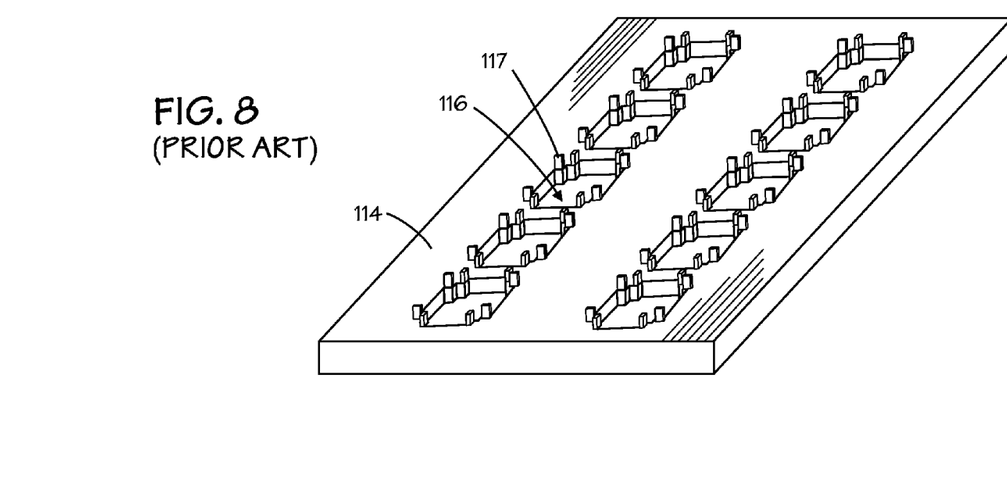
FIG. 8 is pictorial view of an exemplary integrated circuit package rack to hold the exemplary integrated circuit package of FIG. 1 in accordance with the present invention.

The assembly of the circuit package 10 involves a number of process steps that are routinely carried out in different locations. Accordingly, a rack or boat 114 is utilized to hold the circuit package 10 during movement between various processing areas. As better seen in FIG. 8, which is a pictorial view, the boat 114 includes a plurality of openings 116 and two upwardly-projecting posts 117 at each of the corners of the openings 116. The function of the posts 117 is to engage corners of the substrate 14 of the package 10 and thereby restrain yawing movements of the package 10.

Figure 9:
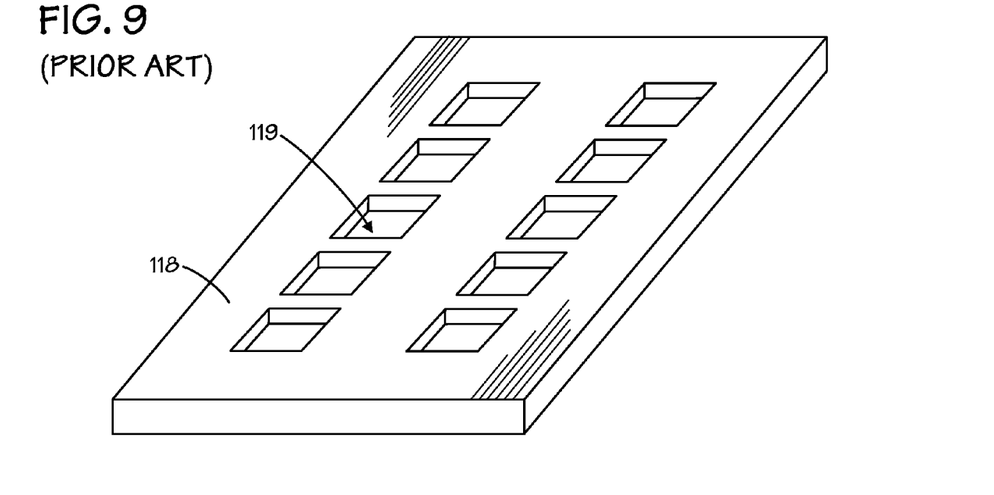
FIG. 9 is a pictorial view of an exemplary integrated circuit package lid plate to aid placement of a lid on the exemplary integrated circuit package of FIG. 1 in accordance with the present invention.

An optional lid alignment plate 118 is depicted in FIG. 9. The alignment plate 118 may be used to facilitate placement of the lid 20 on the substrate 14 of the package. With the lid plate 118 temporarily placed over the package 10 and the base plate 104, the lid 20 is dropped in one of the openings 119 of the lid plate and seated on the substrate 14. The lid plate 118 may be removed prior to positioning of the middle and top plates 106 and 110 depicted in FIG. 7.

It should be understood that movement of the various pieces of the packages 10 as well as various process steps, such as lid preheating, lid placement and lid compression, may be accomplished by automated machine, by hand, or by a combination of the two. For example, a Dai-Ichi Seiko model LAS64 lid attach machine may be used. The LAS64 is capable of high precision lid placement, lid preheating and lid compression. Of course, other types of machines may be used in this regard.

Figure 10:
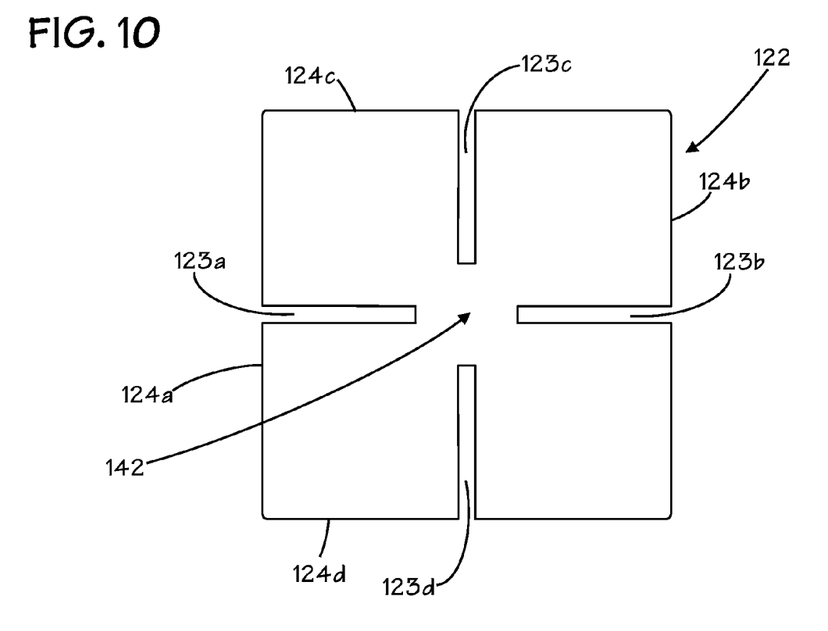
FIG. 10 is a plan view of an alternate exemplary thermal interface material in accordance with the present invention.
Figure 11:
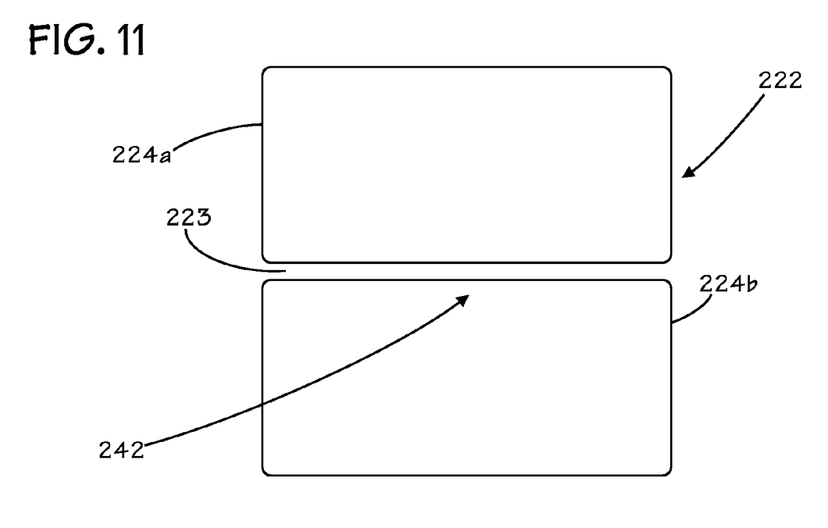
FIG. 11 is a plan view of another alternate exemplary thermal interface material in accordance with the present invention.

As noted briefly above, the thermal interface material formed in accordance with the present invention may be provided with a plurality of channels that may come in a variety of shapes and sizes. Two other illustrative embodiments are depicted in FIGS. 10 and 11, which are both plan views. As depicted in FIG. 10, a preform of a thermal interface material 122 is provided with four channels 123a, 123b, 123c and 123d that extend from the respective edges 124a, 124b, 124c and 124d toward the interior 142 of the thermal interface material 122. Here, the peripheral boundary of the thermal interface material 122 consists of the four edges 124a, 124b, 124c and 124d. But it should be understood that the thermal interface material 122 may be other than rectangular.

In the alternate embodiment depicted in FIG. 11, a preform of a thermal interface material 222 is provided with a single channel 223 that extends from respective edges 224a and 224b to the interior 242 of the thermal interface material 222. Here again, the peripheral boundary of the thermal interface material 222 includes the edges 224a and 224b. But it should be understood that the thermal interface material 222 may be other than rectangular.

Figure 12:
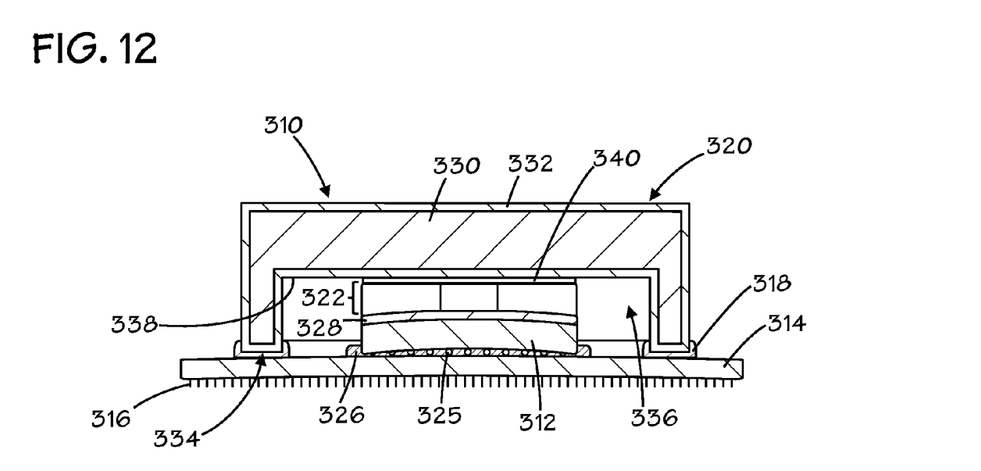
FIG. 12 is sectional view of an exemplary embodiment of an integrated circuit package for a multiple logic core integrated circuit in accordance with the present invention.
Figure 13:
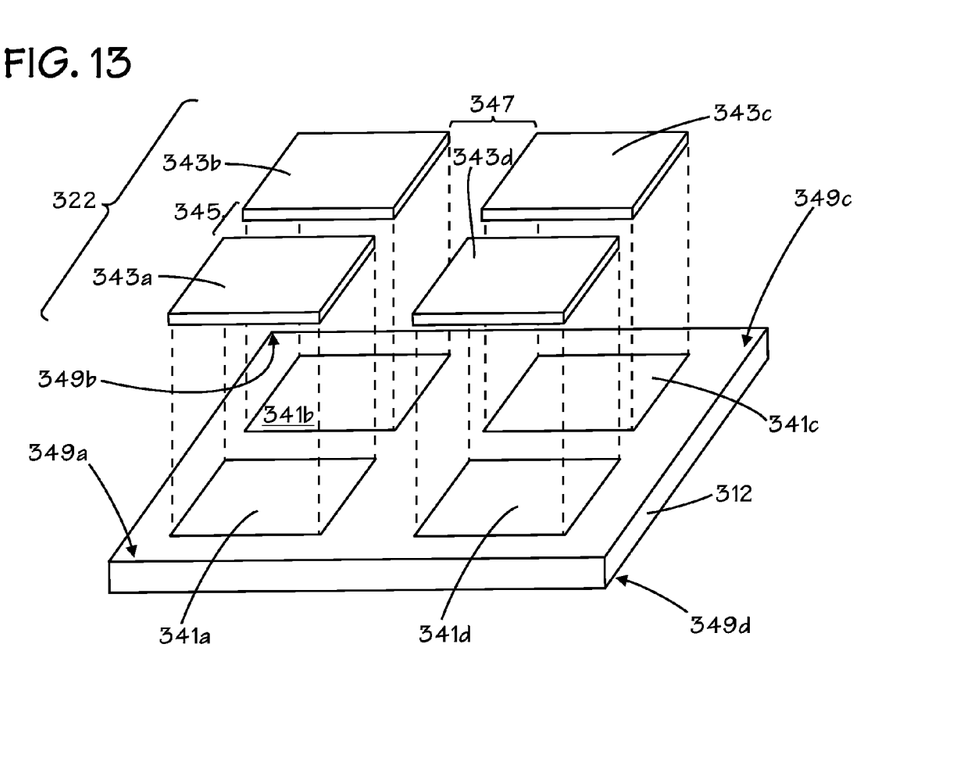
FIG. 13 is an exploded pictorial view of the integrated circuit and a thermal interface material of FIG. 12 in accordance with the present invention.

Newer generation integrated circuits are now frequently manufactured as multicore devices in which large, semi-discrete blocks of logic are combined into a single substrate. A thermal interface material in accordance with the present invention may be fashioned to facilitate the conductive heat transfer from such multicore devices. An exemplary package 310 for a multicore integrated circuit 312 is illustrated in FIGS. 12 and 13. FIG. 12 is a sectional view of the package 310 and FIG. 13 is an exploded pictorial view of just a selected portion of the components shown in FIG. 12. Referring initially to FIG. 12, an exemplary embodiment of the integrated circuit package 310 includes an integrated circuit 312 mounted on a substrate 314. The substrate 314 may be provided with a plurality of conductor pins 316 that form a pin grid array or other pin-type arrangement for providing electrical connection to a socket or other type of electrical connection. Optionally, the substrate 14 may utilize some other form of interconnect, such as, for example, a land grid array or other types of interconnect structures. An adhesive film 318 is provided on the upper surface of the substrate 314 to secure a lid 320 to the substrate 314. A thermal interface material 322, preferably composed of indium, is disposed on the integrated circuit 312. At least one channel 323 of the type described elsewhere herein may be provided in the thermal interface material 322. When the lid 320 is positioned on the substrate 314 and the adhesive film 318 is fully cured as described elsewhere herein, the indium thermal interface material 322 will establish a metallurgical bond with both the integrated circuit 312 and the overlying lid 320.

The integrated circuit 312 may be secured to the substrate 314 in a great variety of ways. In the embodiment illustrated, the integrated circuit 312 is flip-chip mounted to the substrate 314. A plurality of solder bumps 325 are positioned between the lower surface of the integrated circuit 312 and the upper surface of the substrate 314. The bumps 325 provide electrical interconnects between the integrated circuit 312 and a plurality of electrical conductors (not shown) positioned on the substrate 314 that are interconnected to the conductor pins 316. An underfill layer 326 is provided beneath the integrated circuit 312 to serve principally as a cushion for the integrated circuit 312 against both physical and thermal expansion loads subjected to the integrated circuit.

To facilitate the wetting of the indium thermal interface material 322 to the integrated circuit 312, the upper surface, i.e., the backside, of the integrated circuit 312 is provided with a metallization stack 328 that consists of an aluminum film formed on the integrated circuit, a titanium film formed on the aluminum film, a nickel-vanadium film formed on the titanium film and a gold film formed on the nickel-vanadium film. The aluminum film provides advantageous adhesion with silicon. The titanium film provides a barrier layer to prevent gold from migrating into the integrated circuit while the nickel-vanadium film provides desirable adhesion between with gold and the gold film provides a desirable wetting surface for indium. The selection appropriate materials for the backside metallization will depend on the composition of the integrated circuit 312 and the thermal interface material 322. The stack 328 is formed on the integrated circuit 312 prior to application of the thermal interface material 322.

The lid 320 is advantageously composed of a material or materials with a relatively favorable conductive heat transfer coefficient. In an exemplary embodiment, the lid 320 consists of a copper core 330 surrounded by a nickel jacket 332. The lid 320 is generally rectangular and may be substantially square if desired. The lid 320 includes a downwardly projecting perimeter wall 334 that defines an interior space 336. The interior space 336 is sized to more than accommodate the footprint of the integrated circuit 312 and the overlying thermal interface material 322. Note that the adhesive film 318 is applied to the upper surface of the substrate 314 with a footprint that generally tracks the footprint of the perimeter wall 334 of the lid 320. To facilitate metallurgical bonding between the thermal interface material 322 composed of indium and the lower surface 338 of the lid 320, a thin film of gold 340 is positioned on the lower surface 338 of the lid 320. The various thicknesses of the thermal interface material 322, the gold film 340 as well as the vertical dimension of the interior space 336 are selected so that when the lid 320 is seated on the adhesive film 318, the thermal interface material 322 and the overlying gold film 340 will be in physical contact.

Multicore integrated circuits tend to be larger in area or footprint than their single core brethren. The larger die size can magnify the effects of mismatches in the coefficients of thermal expansion between the integrated circuit 312, the thermal interface material 322 and the lid 320. One fallout of these mismatches in coefficient of thermal expansion is warpage of the substrate 314 and, more significantly, of the integrated circuit 312. The warpage of the integrated circuit 312 and the substrate 314 are shown somewhat exaggerated in FIG. 12 for clarity of illustration. If the extent of warpage or the stress caused thereby is too great, the integrated circuit 312 may be damaged.

Additional detail of the thermal interface material 322 and the way in which it addresses the problem of warpage may be understood by referring now also to FIG. 13. The multicore integrated circuit 312 includes four cores 341$a$, 341$b$, 341$c$ and 341$d$. The thermal interface material 322, shown exploded from the integrated circuit 312, is sub-divided into four preforms 343$a$, 343$b$, 343$c$ and 343$d$ that are spaced apart to define two channels 345 and 347. The channels 345 and 347 extend inwardly from the outer periphery of the preforms 343$a$, 343$b$, 343$c$ and 343$d$. The preforms 343$a$, 343$b$, 343$c$ and 343$d$ are sized and shaped to have respective footprints that track the general footprints of the underlying cores 341$a$, 341$b$, 341$c$ and 341$d$ and preferably with slightly larger footprints than the underlying cores 341$a$, 341$b$, 341$c$ and 341$d$. The goal here is to ensure that an adequate supply of thermal interface material is provided at the cores 341$a$, 341$b$, 341$c$ and 341$d$, which present the areas of greatest heat generation on the integrated circuit 312. However, the sub-dividing of the thermal interface material 322 into multiple detached preforms 343$a$, 343$b$, 343$c$ and 343$d$ not only provides lateral escape routes for any trapped flux remnants, but also reduces stress on the integrated circuit 312 resulting from warpage. The warpage stresses on the integrated circuit 312 tend to be most troublesome at the corners 349$a$, 349$b$, 349$c$ and 349$d$. But because the preforms 343$a$, 343$b$, 343$c$ and 343$d$ are decoupled, each of the preforms 343$a$, 343$b$, 343$c$ and 343$d$ can move independently of the others during thermal cycling. This capacity of independent movement results in a very compliant thermal interface material layer 322. The enhanced compliance reduces stresses on the integrated circuit 312, particularly at the corners 349$a$, 349$b$, 349$c$ and 349$d$ thereof.

As with the other embodiments described elsewhere herein, the number, and configuration of the channels 345 and 347, and of course the preforms 343$a$, 343$b$, 343$c$ and 343$d$ are subject to great variety. Indeed, if the channels 345 and 347 are small enough, the preforms 343$a$, 343$b$, 343$c$ and 343$d$ may fuse together during reflow and eliminate the channels 345 and 347. Furthermore, although the integrated circuit 312 is depicted as being a quad-core, any multicore circuit may be accommodated by an appropriately shaped thermal interface material 322. As noted above, at least one channel 323 may be provided in at least one of the preforms, in this example in preform 343$c$. Some or all of the preforms 343$a$, 343$b$, 343$c$ and 343$d$ maybe provided with channels 323.

The package 310 may be assembled using the same general procedure described elsewhere herein in conjunction with FIG. 6. The preforms 343a, 343b, 343c and 343d and channels 345 and 347 may be formed by removing material from a single sheet that is placed on the integrated circuit 312 or by arranging multiple smaller sheets on the integrated circuit 312.

As noted above in conjunction with FIGS. 1, 2, 3 and 6, the indium thermal interface material 22 may be first applied to the integrated circuit and the lid 20 thereafter seated on the substrate 14. However, another option that may be used with single or multicore integrated circuits involves the preattachment of an indium thermal interface material to the lid and the subsequent attachment of the lid to the substrate. This alternate embodiment may be understood by referring now to FIG. 14, which is a cross-sectional view like FIG. 2 but of an alternate exemplary embodiment of the integrated circuit package 410. This illustrative embodiment shares many characteristics of the embodiment depicted in FIG. 2, including an integrated circuit 412, a substrate 414, conductor pins 416, a perimeter-like adhesive film 418 and a lid 420. The integrated circuit 412 is provided with a backside metallization stack 428. However, an indium preform film or foil 422 is preattached to the lid 420.

Figure 14:
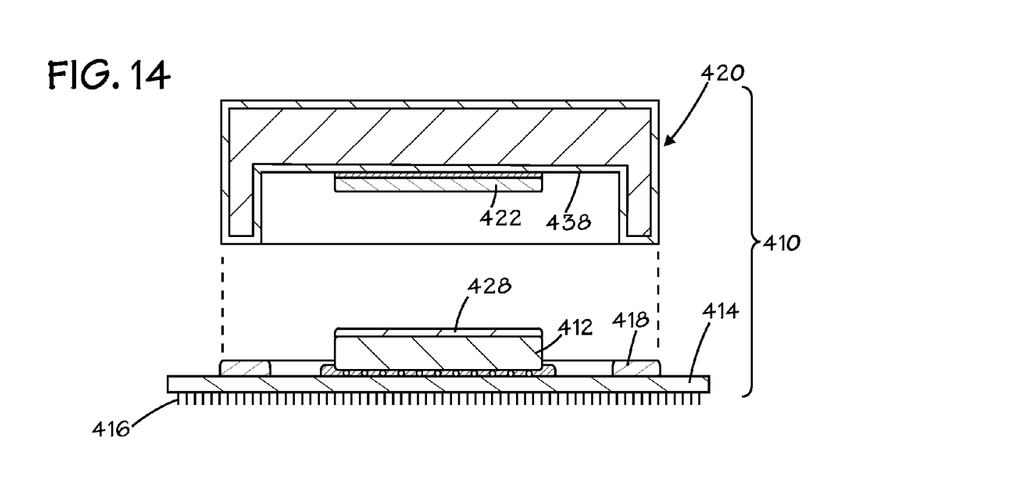
FIG. 14 is an exploded sectional view of an alternate embodiment of an integrated circuit package in accordance with the present invention.

The method of applying the preattached indium thermal interface material 422 is variable. However, in an illustrative embodiment, the preattachment involves applying a flux to the underside 438 of the lid 420, placing an indium piece or foil 422 (or multiple foils if the integrated circuit 412 is multicore) on the underside 438, performing a reflow heating step, applying a finishing flux to the reflowed indium foil 422, performing another reflow heating step, performing a cleaning step to remove excess flux, performing a stamping or "coining" of the indium foil 422 to achieve a desired thickness of the indium foil 422 and, finally, applying a layer of rosin-based flux to the coined indium foil 422. Of course, the coining may also be used to form any channels in the preform 422. Optionally, other channel forming techniques may be used.

A gold film on the underside 438 of the lid 420 is optional. With a preattached indium foil 422, the process flow described elsewhere herein in conjunction with FIG. 6, may be followed to attach the lid 420, albeit without the necessity of performing the step 70 of placing the thermal interface material on the integrated circuit separately.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of packaging an integrated circuit, comprising:
    mounting an integrated circuit on a substrate;
    coupling an indium preform to the integrated circuit, the indium preform including a first surface and a second surface opposite to the first surface, an interior portion, a peripheral boundary and a channel extending from the peripheral boundary towards the interior portion; and
    wherein the peripheral boundary is unbounded laterally.

2. The method of claim 1, wherein the indium preform is provided with a rectangular peripheral boundary.

3. The method of claim 1, wherein the indium is provided with another channel extending from the peripheral boundary towards the interior portion.

4. The method of claim 1, wherein the indium preform is provided with the channel extending from the first surface to the second surface of the indium preform.

5. The method of claim 1, wherein the channel is provided with a rectangular shape.

6. The method of claim 1, wherein the indium preform is provided with a peripheral boundary that comprises first and second opposing edges, the channel extending from the first edge to the second edge.

7. The method of claim 1, wherein the channel is formed by cutting the indium preform.

8. The method of claim 1, comprising attaching a lid to the substrate.

9. The method of claim 8, comprising reflowing the indium preform.

10. The method of claim 1, wherein the coupling of the indium preform comprises coupling the indium preform to a lid and thereafter coupling the lid to the substrate.

11. A method of packaging an integrated circuit having a plurality of logic cores, comprising:
    mounting an integrated circuit having a plurality of logic cores on a substrate;
    providing an indium preform for each of the logic cores, wherein each of the indium preform includes a peripheral boundary;
    positioning the plurality of indium preforms on the integrated circuit in spaced apart relation to one another prior to melting such that each of the plurality of indium preforms is positioned over and corresponds to one of the plurality of logic cores and, wherein the peripheral boundaries are unbounded laterally.

12. The method of claim 11, wherein each of the indium preforms is provided with a rectangular peripheral boundary.

13. The method of claim 11, wherein a given logic core has a first footprint and the indium preform corresponding to the given logic core is provided with a second footprint that substantially matches the first footprint.

14. The method of claim 11, wherein the plurality of logic cores comprises four logic cores and the plurality of indium preforms comprises four indium preforms.

15. The method of claim 11, comprising attaching a lid to the substrate.

16. The method of claim 15, comprising reflowing the indium preform.

17. The method of claim 11, wherein at least one of the indium preforms comprises an interior portion, a peripheral boundary, and a channel extending from the peripheral boundary towards the interior portion.

18. The method of claim 11, wherein the positioning of the plurality of indium preforms comprises coupling the plurality of indium preforms to a lid and thereafter coupling the lid to the substrate.

* * * * *